United States Patent
Chen et al.

(10) Patent No.: US 6,479,883 B1
(45) Date of Patent: Nov. 12, 2002

(54) ELECTROSTATIC DISCHARGE PROTECTION CIRCUIT

(75) Inventors: Shiao-Shien Chen, Chung-Li (TW); Tien-Hao Tang, Taipei Hsien (TW)

(73) Assignee: United Microelectronics Corp., Hsinchu (TW)

( * ) Notice: Subject to any disclaimer, the term of this patent is extended or adjusted under 35 U.S.C. 154(b) by 2 days.

(21) Appl. No.: 09/585,563

(22) Filed: Jun. 2, 2000

(30) Foreign Application Priority Data

May 4, 2000 (TW) ...................................... 89207377 U

(51) Int. Cl.[7] .............................................. H01L 29/00
(52) U.S. Cl. ........................ 257/546; 257/347; 257/355; 257/357; 257/369
(58) Field of Search ................................ 257/347, 355, 257/357, 369, 507, 546

(56) References Cited

U.S. PATENT DOCUMENTS

| | | | | |
|---|---|---|---|---|
| 5,321,293 A | * | 6/1994 | Mojaradi et al. | 257/369 |
| 5,608,340 A | * | 3/1997 | Shibata et al. | 326/36 |
| 5,844,272 A | * | 12/1998 | Soderbarg et al. | 257/328 |
| 5,880,620 A | * | 3/1999 | Gitlin et al. | 327/534 |
| 6,274,908 B1 | * | 8/2001 | Yamaguchi et al. | 257/355 |

* cited by examiner

*Primary Examiner*—Eddie Lee
*Assistant Examiner*—Matthew E. Warren
(74) *Attorney, Agent, or Firm*—J. C. Patents

(57) ABSTRACT

An electrostatic discharge protection circuit formed between an input/output pad and an internal circuit that can be applied to a silicon-on-insulator type of MOSFET. The protection circuit includes two n-type tunneling source-body contact devices connected in a series to form two sets of parasitic diode/zener diode pairs that serve as electrostatic discharge routes. When an excessive positive voltage or negative voltage is applied, one of the n-type tunneling source-body contact devices becomes a conductive NMOS transistor forming a discharge route for electrostatic charges. Meanwhile, the other n-type device operates reversely and acts like a zener diode when a definite voltage is exceeded. The zener diode, together with a parasitic diode, provides another discharge route for electrostatic charges.

11 Claims, 2 Drawing Sheets

ELECTROSTATIC DISCHARGE PROTECTION CIRCUIT

CROSS-REFERENCE TO RELATED APPLICATION

This application claims the priority benefit of Taiwan application serial no. 89207377, filed May 4, 2000.

BACKGROUND OF THE INVENTION

1. Field of Invention

The present invention relates to an electrostatic discharge protection circuit. More particularly, the present invention relates to a MOSFET having a tunnel source-body contact device that can be applied to a silicon-no-insulation (SOI) substrate.

2. Description of Related Art

Electrostatic discharge is one of the leading causes of damage to integrated circuits(IC) such as dynamic random access memory (DRAM) and static random access memory (SRAM) during manufacturing and post-manufacture transportation. For example, a person walking on carpet in a high relative humidity environment can generate several hundred to several thousand volts of static electricity. Under exceptionally dry conditions, up to ten thousand volts may be generated. When a charged body comes into contact with a silicon chip, static electricity may discharge, causing irreparable damages to the chip. To minimize damages to the chip due to electrostatic discharge, hard-wired electrostatic discharge circuits are often provided. In other words, an on-chip electrostatic discharge protection circuit is formed between the internal circuit and each bonding pad.

FIG. 1 is a circuit diagram of a conventional electrostatic discharge protection circuit. As shown in FIG. 1, the electrostatic discharge protection circuit is formed between the input/output pad 10 and the internal circuit 12. Any excess voltage applied to the input/output pad 10 is discharged so that a suitable range of voltage is input into the internal circuit 12. The electrostatic discharge circuit includes a PMOS transistor 14 and an NMOS transistor 16. The source terminal of the PMOS transistor 14 is connected to a voltage Vdd. The gate terminal and the source terminal of the PMOS transistor 14 are connected together. The drain terminal of the NMOS transistor 16 is connected to the drain terminal of the PMOS transistor 14. The drain terminal of the NMOS transistor 16 and the drain terminal of the PMOS transistor 14 are connected to a junction point 18 between the input/output pad 10 and the internal circuit 12. Both the gate terminal and the source terminal of the NMOS transistor 16 are connected to an earth voltage Vss.

The bulk electrostatic discharge protection circuit as shown in FIG. 1 has a gated N-P structure. Hence, the substrate portion of the PMOS transistor 14 and the NMOS transistor 16 are connected to the respective source terminals, which are in turn connected to a source voltage Vdd and an earth voltage Vss, respectively. Consequently, a parasitic diode 20 is formed between the PMOS transistor 14 and the junction point 18. Similarly, a parasitic diode 22 is formed between the NMOS transistor 16 and the junction point 18. In other words, parasitic diodes are formed at the junction between the drain terminals and the substrate. When the input/output pad 10 is subjected to an excessive negative voltage, the parasitic diode 22 conducts so that a discharge path from an input/output pad 10 to earth voltage Vss for the negative stress is provided. On the other hand, when the input/output pad 10 is subjected to an excessive positive voltage, the parasitic diode 20 conducts so that a discharge path from an input/output pad 10 to voltage Vdd for the positive stress is provided.

As techniques for manufacturing sub-micron devices have matured, a silicon-on-insulator (SOI) type of CMOS has emerged. In SOI technology, a layer of insulator is formed not too far from the surface of a silicon substrate so that the substrate surface of the CMOS device is separated from the silicon bulk. Hence, the source terminal and the substrate will not latch with the well and substrate material. In other words, the gated N-P structure shown in FIG. 1 is unsuitable for SOI CMOS. This is because the SOI device is a three-terminal device, while the electrostatic discharge protection circuit device is a four-terminal device. When SOI CMOS is used as an electrostatic discharge protection circuit, no parasitic diodes are formed at the junction between the drain terminal and the substrate. Since the capacity to eliminate positive or negative stress is lost, the electrostatic discharge circuit no longer functions.

SUMMARY OF THE INVENTION

Accordingly, one object of the present invention is to provide an electrostatic discharge protection circuit suitable for protecting SOI CMOS.

To achieve these and other advantages and in accordance with the purpose of the invention, as embodied and broadly described herein, the invention provides an electrostatic discharge protection circuit. The protection circuit is formed between an input/output pad and an internal circuit. The protection circuit includes two n-type tunneling source-body contact devices connected in a series. The drain terminal of the first n-type tunneling source-body contact device is connected to a high voltage. The gate terminal of the first n-type tunneling source-body contact device is also connected to the source terminal. The source terminal of the first n-type tunneling source-body contact device is connected to a junction point between the input/output pad and the internal circuit. The drain terminal of the second n-type tunneling source-body contact device is connected to the source terminal of the first n-type tunneling source-body contact device. Both the gate terminal and the source terminal of the second n-type tunneling source-body contact device are connected to a low voltage.

The first and the second n-type tunneling source-body contact device structurally comprise of a substrate layer, an insulation layer, a drain region, a p+ region, a p-well region, a source region, a gate region and two sidewall spacers. The substrate layer is at the bottom with the insulation layer on top to form an SOI basic structure. The source region, the p+ region, the p-well region and the drain region are formed above the insulation layer in such a way that they are sequentially connected. The gate region is formed above a portion of the p-well region. Finally, spacers are formed on the sidewalls of the gate region above a portion of the p-well region, the drain region and the source region.

The substrate layer can be a p-type layer, and the insulation layer can be a silicon dioxide layer, for example. In addition, a metallic layer can be deposited over the drain region, the source region and the gate region for connecting to a plurality of external voltages. In general, the low voltage is obtained by connecting to an earth voltage.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
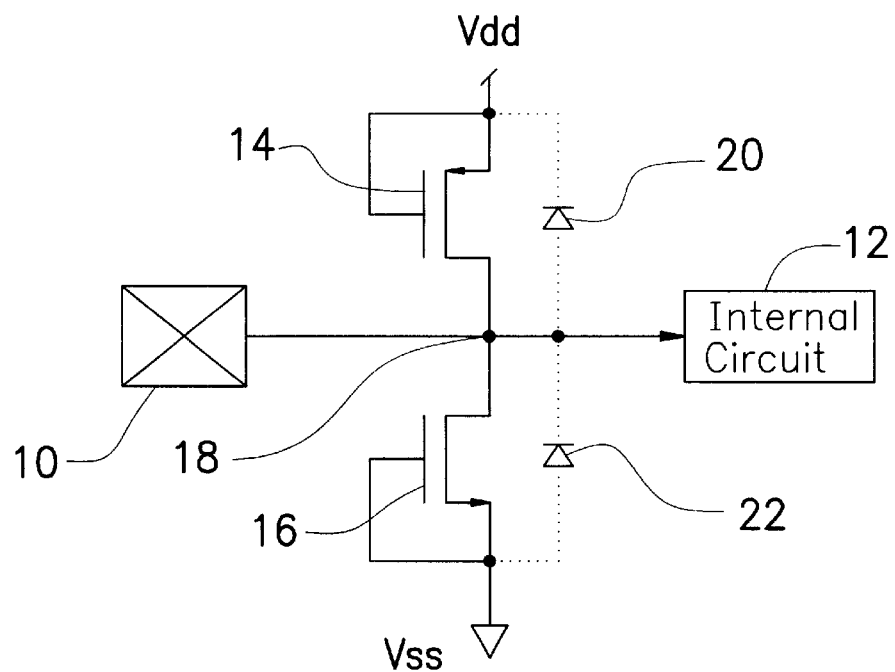
FIG. 1 is a circuit diagram of a conventional electrostatic discharge protection circuit.

Reference will now be made in detail to the present preferred embodiments of the invention, examples of which are illustrated in the accompanying drawings. Wherever possible, the same reference numbers are used in the drawings and the description to refer to the same or like parts.

Figure 2:
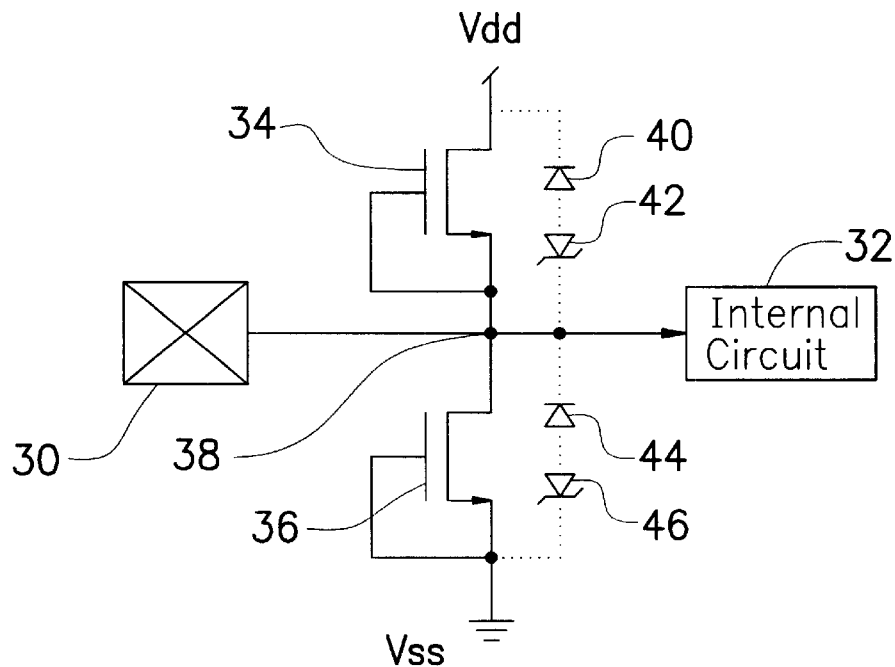
FIG. 2 is a circuit diagram of an electrostatic discharge protection circuit according to one preferred embodiment of this invention.

FIG. 2 is a circuit diagram of an electrostatic discharge protection circuit according to one preferred embodiment of this invention. The electrostatic discharge, protection circuit can be applied to SOI technology. As shown in FIG. 2, the electrostatic discharge protection circuit is connected to a junction point 38 between an input/output pad 30 and an internal circuit 32.

Instead of gated N-P structures, the discharge protection circuit uses two serially connected n-type tunneling source-body contact devices. In FIG. 2, the drain terminal of the first n-type tunneling source-body contact device 34 is connected to a high voltage Vdd. The source terminal and the gate terminal of the first n-type device 34 is connected to a junction point 38 between the input/output pad 30 and the internal circuit 32. The drain terminal of the second n-type tunneling source-body contact device 36 is connected to the source terminal of the first n-type device 34. The gate terminal and the source terminal of the second n-type device 36 are connected to a low voltage Vss such as an earth voltage.

By connecting the first n-type device 34 and the second n-type device 36 to the junction point 38 between the input/output pad 30 and the internal circuit 32, two sets of parasitic diode/zener diode pairs are produced (the reason is explained below with reference to FIG. 3). In other words, a first set of diodes including a parasitic diode 40 and a zener diode 42 is formed between the drain terminal of the first n-type tunneling source-body contact device 34 and the junction point 38, while a second set of diodes including a parasitic diode 44 and a zener diode 46 is formed between the source terminal of the second n-type tunneling source-body contact device 36 and the junction point 38.

When an excessive positive voltage is applied to the input/output pad 30, the second n-type device 36 is used as a discharge path creating a positive stress relative to the voltage Vss. In the meantime, the zener diode 42 serves a reverse operation permitting current to pass through the parasitic diode 40 when a definite voltage is exceeded. Hence, another discharge path is created by forming a positive stress relative to the voltage Vdd.

Similarly, when an excessive negative voltage is applied to the input/output pad 30, the first n-type device 34 is used as a discharge path creating a negative stress relative to the voltage Vdd. In the meantime, the zener diode 46 serves a reverse operation permitting current to pass through the parasitic diode 44 when a definite voltage is exceeded. Hence, another discharge path is created by forming a negative stress relative to the voltage Vss.

The reason that a set of parasitic diode/zener diode pairs is formed between the first n-type contact device 34 and the second n-type contact device 36 can be explained with reference to the structure shown in FIG. 3. FIG. 3 is a schematic cross-sectional view of a tunneling source-body contact device according to this invention. As shown in FIG. 3, the bottom layer 50 is a silicon-on-insulation (SOI) layer. The SOI layer includes an insulation layer on top of a substrate layer with the insulation layer serving as an electrical isolator. The substrate layer can be a p-type substrate, and the insulation layer can be a silicon dioxide layer. A source region 52, a p+ region 54, a p-well region 56 and a drain region 58 are formed over the SOI layer 50. The source region 52, the p+ region 54, the p-well region 56 and the drain region 58 are sequentially connected. A gate region 60 is formed over a portion of the p-well region 56. Two spacers 62 and 64 are formed on the respective sidewalls of the gate region 60 above a portion of the p-well region 56, the source region 52 and the drain region 58. In addition, metallic layers 66, 68 and 70 are formed over the source region 52, the drain region 58 and the gate region 60, respectively. The metallic layers 66, 68 and 70 are connection lines to different external voltages.

In this invention, the metallic layer 68 on the drain region 58 may connect to the input/output pad while the metallic layer 66 on the source region 52 may connect to the voltage terminal Vss. The metallic layer 70 on the gate region 60 may connect with the metallic layer 66 on the source region 52. Ultimately, the parasitic diode 44 and the zener diode 46 for the second n-type tunneling source-body contact device 36, shown in FIG. 2, are formed. The n+ion-doped source region 52 and the p+ region 54 form the zener diode 46. Meanwhile, the p-well region 56 and the n+ion-doped drain region 58 form the parasitic diode 44. Similarly, the metallic layer 68 on the drain region 58 may connect to the voltage Vdd, while the metallic layer 66 on the source region 52 may connect to the input/output pad. The metallic layer 70 on the gate region 60 may connect with the metallic layer 66 on the source region 52. Ultimately, the parasitic diode 40 and the zener diode 42 for the first n-type tunneling source-body contact device 34, shown in FIG. 2, are formed.

Figure 3:
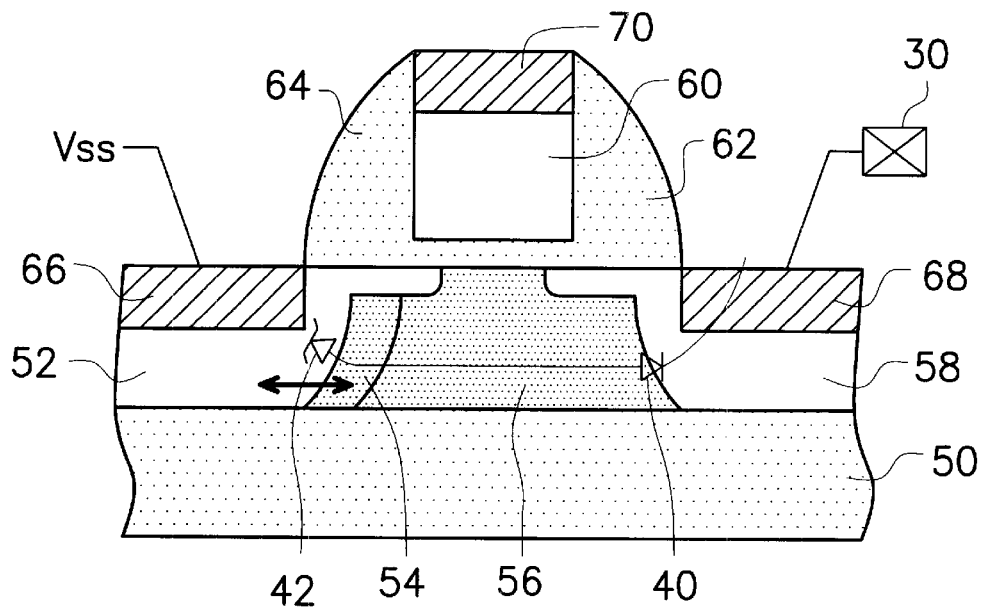
FIG. 3 is a schematic cross-sectional view of a tunneling source-body contact device according to this invention.
Figure 4A:
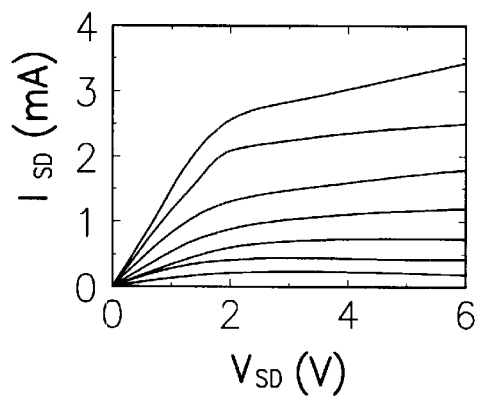
FIG. 4A is a graph showing the I–V characteristic of the tunneling source-body contact device of FIG. 3 working under normal operating conditions.
Figure 4B:
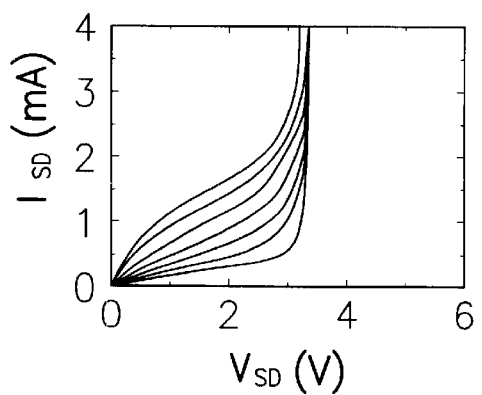
FIG. 4B is a graph showing the I–V characteristic of the tunneling source-body contact device of FIG. 3 working under reverse operating conditions.

FIGS. 4A and 4B are graphs showing the I–V characteristic of the tunneling source-body contact device of FIG. 3 working under normal operating conditions and reverse operating conditions, respectively. Under normal operation, voltage at the drain terminal VD of the tunneling source-body contact device is greater than voltage at the source terminal VS (that is, VD >VS). Since the source region 52 shown in FIG. 3 includes a p+ region 54, kinking effect will disappear resulting in an I–V graph shown in FIG. 4A. On the contrary, under reverse operation, voltage at the drain terminal VD of the tunneling source-body contact device is lesser than voltage at the source terminal VS (that is, VS>VD). Hence, the device functions like a gate-control zener diode with a characteristic I–V variation shown in FIG. 4B.

In summary, the electrostatic discharge protection circuit of this invention makes use of two serially connected n-type tunneling source-body contact devices to form two sets of parasitic diode/zener diode pairs that serve as electrostatic discharge routes. When excessive positive or negative voltage is applied, one of the n-type tunneling source-body contact devices becomes a conductive NMOS transistor forming an electrostatic discharge route. Meanwhile, the other n-type device operates in reverse operation and acts like a zener diode when a definite voltage is exceeded. The zener diode, together with a parasitic diode, provides another discharge route for electrostatic charges.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electrostatic discharge protection circuit between an input/output pad and an internal circuit, comprising:

a first n-type tunneling source,body contact device, wherein a drain terminal of the first n-type device is connected to a high voltage source, and a source terminal and a gate terminal of the first n-type device are connected to a junction point between the input/output pad and the internal circuit; and a second n-type tunneling source-body contact device, wherein a drain terminal of the second n-type device is connected to the source terminal of the first n-type device, and a gate terminal and a source terminal of the second n-type device are connected to a low voltage source.

2. The circuit of claim 1, wherein the first n-type tunneling source-body contact device includes:

a substrate layer;
    an insulation layer above the substrate layer;
    a source region above a portion of the insulation layer;
    a $p^+$ region above a portion of the insulation layer connected with the source region;
    a p-well region above a portion of the insulation layer connected with the $p^+$ region;
    a drain region above a portion of the insulation layer connected with the p-well region;
    a gate region above a portion of the p-well region; and
    a spacer on each side of the gate region, in contact with a sidewall of the gate region and above a portion of the p-well region, the drain region and the source region.

3. The circuit of claim 2, wherein the substrate layer includes a p-type substrate.

4. The circuit of claim 2, wherein the insulation layer includes a silicon dioxide layer.

5. The circuit of claim 2, wherein a metallic layer is formed over the drain region, the source region and the gate region serving as connecting lines to different source voltages.

6. The circuit of claim 1, wherein the second n-type tunneling source-body contact device includes:

a substrate layer;
    an insulation layer above the substrate layer;
    a source region above a portion of the insulation layer;
    a $p^+$ region above a portion of the insulation layer connected with the source region;
    a p-well region above a portion of the insulation layer connected with the p+ region;
    a drain region above a portion of the insulation layer connected with the p-well region;
    a gate region above a portion of the p-well region; and
    a spacer on each side of the gate region, in contact with a sidewall of the gate region and above a portion of the p-well region, the drain region and the source region.

7. The circuit of claim 6, wherein the substrate layer includes a p-type substrate.

8. The circuit of claim 6, wherein the insulation layer includes a silicon dioxide layer.

9. The circuit of claim 6, wherein a metallic layer is formed over the drain region, the source region and the gate region serving as connecting lines to different source voltages.

10. The circuit of claim 1, wherein the low voltage includes an earth voltage connection.

11. An electrostatic discharge protection (ESD) circuit structure between an input/output pad and an internal circuit, wherein the ESD circuit is formed on a silicon-on-insulation (SOI) substrate and the SOI substrate includes a semiconductor substrate, an insulating layer on the semiconductor substrate, and a silicon layer on the insulating layer, the ESD circuit structure formed on the SOI substrate comprising:

a first n-type tunneling source-body contact device, wherein a drain terminal of the first n-type device is connected to a high voltage source, and a source terminal and a gate terminal of the first n-type device are connected to a junction point between the input/output pad and the internal circuit, wherein a first parasitic Zener diode and a first parasitic diode are produced in electrical connection between the source terminal and the drain terminal of the first n-type tunneling source-body contact device; and a second n-type tunneling source-body contact device, wherein a drain terminal of the second n-type device is connected to the source terminal of the first n-type device, and a gate terminal and a source terminal of the second n-type device are connected to a low voltage source, wherein a second parasitic Zener diode and a second parasitic diode are produced in electrical connection between the source terminal and the drain terminal of the second n-type tunneling source-body contact device.

* * * * *